United States Patent
Kossel

(10) Patent No.: US 7,323,913 B1
(45) Date of Patent: Jan. 29, 2008

(54) MULTIPHASE DIVIDER FOR P-PLL BASED SERIAL LINK RECEIVERS

(75) Inventor: Marcel A. Kossel, Reichenburg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/871,578

(22) Filed: Oct. 12, 2007

(51) Int. Cl.
H03K 21/00 (2006.01)

(52) U.S. Cl. .................. 327/115; 327/117; 377/47; 377/48

(58) Field of Classification Search ............... 327/115, 327/117; 377/47, 48
See application file for complete search history.

(56) References Cited

U.S. PATENT DOCUMENTS 6,894,551 B2 * 5/2005 Johnson ............... 327/258
7,030,674 B2    4/2006 Johnson
2006/0119408 A1  6/2006 Chan et al.

* cited by examiner

Primary Examiner—Kenneth B. Wells
(74) Attorney, Agent, or Firm—Cantor Colburn LLP; Peter Klett

(57) ABSTRACT

A multiphase divider includes a plurality of resetable dividers configured for performing resetable divider stages to a plurality of multiphase signals forming a plurality of divided multiphase signals having a monotonic increasing phase with equal spacing and an ideal duty cycle of 50%, wherein the plurality of divided multiphase signals have no phase ambiguity; and a reset signal generator configured for producing a plurality of periodic reset signals to the plurality of resetable dividers to enable the plurality of resetable dividers to divide the plurality of multiphase signals in a timely correct sequence to form the divided multiphase signal, the plurality of periodic reset signals being produced by a combinational network of the reset signal generator, the combinational network is configured for generating a number of pulses based on the plurality of multiphase signals and performing decimation stages to reduce the number of pulses within the pulse traces.

4 Claims, 8 Drawing Sheets

MULTIPHASE DIVIDER FOR P-PLL BASED SERIAL LINK RECEIVERS

BACKGROUND OF THE INVENTION

1. Field of the Invention

This invention relates to frequency dividers that divide a set of multiphase signals such that the multiphase characteristic of having a monotonic and equally spaced phase increase with 50% duty cycle is still maintained in the divided multiphase output signals.

2. Description of Background

A multiphase signal is defined as a set of sinusoidal or rectangular signals with the individual signal components having equally spaced phase differences and a monotonic increase of phase when going from one signal to the next one. A typical example of a multiphase signal generator is a ring oscillator used for instance as voltage-controlled oscillator (VCO) in a phase-locked loop circuit (PLL). Such a ring oscillator consists of a ring of N identical delay cells each having a delay of $\tau_D$. The oscillation frequency is then given by $f_{osc}=1/T=½N\tau_D$. If each delay cell output is fed to the output of the VCO, the oscillator provides N output signals each oscillating with $f_{osc}$ but also each having a phase difference of $2\pi/N$ with respect to its neighboring signal. The total of N signals is termed multiphase signal whereas the phase of the individual signals monotonically increases by the equal spacing of $2\pi/N$ when going from one signal to the next one. In terms of time units the phase differences between the individual components of the multiphase signal can also be expressed as T/N where T denotes the period of the multiphase signal.

A conventional multiphase divider is shown in FIG. 1. It consists of N toggle flip-flops according to the N components of the multiphase input signal. All of the toggle flip-flops are operated in parallel to each other. They are implemented as D-flip flops with a cross-connected feedback path from the inverting output Qb to the data input D. By cascading M of these toggle flip-flops a frequency division ratio of M can be obtained. The concatenation is carried out by connecting the non-inverting output Q of the previous divider stage to the clock input of the D-flip flop belonging to the succeeding divider stage. As will be explained in more detail below the straightforward implementation as shown in FIG. 1 has the drawback of suffering from a so-called phase ambiguity problem. That phase ambiguity problem is associated to the cross-connected feedback path (connection from Qb to D) in the toggle flip-flops that can assume an arbitrary state (either logical one or zero) at start-up and is a consequence of the mutual independency of the individual dividers. Because of this non-well defined initial state the dividers may start dividing in such a way that the divided output signal is no longer a valuable multiphase signal as the characteristic of having a monotonic increase of equally spaced phases got lost. This characteristic is however of great importance for the application of a multiphase division as will be explained below.

FIG. 2 shows another multiphase divider configuration known in the art. This multiphase divider consists of a set of resetable dividers and a reset delay circuit, which is clocked by one of the multiphase input signals and delays a reset signal coming from an external source. The dividers only take one out of N multiphase signals for the division. To generate a plurality of divided multiphase signals at their output, each of the individual dividers receive a reset signal from the reset delay circuit, which is basically a shift register (sequential logic) for the reset signal and thereby defines the starting point for the division of each individual divider such that the divided outputs are appropriately time-shifted to represent the desired divided multiphase phase signal. The shortcoming of this prior art configuration is that a true multiphase division is not performed but rather a single phase division because only one out of N multiphase inputs is actually used for the division. Consequently, the phase ambiguity problem does not occur; however, the division scheme completely relies on a single phase of the multiphase input. If the phase signal is affected by timing jitter or duty cycle distortion, all of the divided multiphase outputs are affected in the same way, which may be detrimental to the application of such a multiphase divider in a serial link receiver. Moreover, the duty cycle distortion may become a problem because one of the multiphase signals at the input will be much more loaded (higher driving capacity) than all the others because that single phase signal has to drive all of the dividers and also provides the clock for the reset delay circuit. Furthermore, the timing of the multiphase output may also be affected to a certain degree by the timing accuracy of the shift register in the reset delay circuit.

The implementation of a multiphase divider is not as straightforward as it is compared to the case when just having to divide a single-ended or a differential signal. A phase ambiguity problem occurs because of the mutual independency of the dividers when only using a number of conventional dividers in parallel.

When a multiphase signal consisting of, for example, six phases is divided by means of three parallel differential conventional dividers, the divided outputs may have phase ambiguity. An exemplary graph of such phase ambiguity is shown in FIG. 3. It can be seen that the important requirement of having the phases of the six signals monotonically increasing is violated because two out of the six signals got swapped during the division. The incorrect phases are encircled with a dashed circle. The dashed straight line indicates how the individual phases should run if they were a correct multiphase signal with monotonic phase increase and equal spacing between the individual phases. The swapping can be regarded as a 180-degree phase shift applied to the corresponding signals. This is an example of the phase ambiguity problem that is caused by the fact that the feedback paths in a conventional divider (typically implemented as a cross-coupled feedback connected D-flip flop also known as toggle flip flop) either assumes a 0-degree (e.g. logical 0) or a 180-degree (e.g. logical 1) state with respect to the pertinent input signal.

One solution to the phase ambiguity problem is to have the parallel dividers be dependent on each other. However, this approach suffers from requiring the introduction of internal feedback loops that may affect the required 50% duty cycle requirement, which is of great importance to prevent bimodal jitter effects in a half-rate receiver architecture. Another solution is to have appropriate startup conditions that remedy these shortcomings.

Currently, no designs employ a multiphase divider in their feedback path from the VCO to the phase detector in order to make the phase-rotating PLL (P-PLL) a frequency multiplying PLL. Since no feedback divider is used (the feedback division ratio equals 1 in that case), most current designs have to use a reference signal for the P-PLL that equals in frequency the output signals of the P-PLL used to drive the sampling latches in the serial link receiver.

If for instance the serial data stream is transmitted at 10 Gb/s, the P-PLL needs to provide a 5 GHz multiphase signal with a perfect 50% duty cycle if the serial link receiver is of a half-rate architecture with 3-fold oversampling per bit and a multiphase signal consisting of 6 phases is assumed. As a consequence thereof, the reference signal of the P-PLL also needs to be at 5 GHz for this 10 Gb/s serial link. Typically there are tens or hundreds of serial links on a chip that all need to receive a reference signal for their P-PLL type of link receiver. Distributing for instance a 5 GHz clock signal to all of these many link receivers consumes a considerable amount of power because the power consumption P is in a first order proportional to the frequency ($P=C \cdot VDD^2 \cdot f$ where C denotes the load capacitance, VDD the supply voltage and f the frequency). Reducing the frequency of the reference clock signal would therefore help save a lot of power.

SUMMARY OF THE INVENTION

The shortcomings of the prior art are overcome and additional advantages are provided through the provision of a multiphase divider, comprising: a plurality of resetable dividers configured for performing resetable divider stages to a plurality of multiphase signals forming a plurality of divided multiphase signals having a monotonic increasing phase with equal spacing and an ideal duty cycle of 50%, wherein the plurality of divided multiphase signals have no phase ambiguity; and a reset signal generator configured for producing a plurality of periodic reset signals to the plurality of resetable dividers to enable the plurality of resetable dividers to divide the plurality of multiphase signals in a timely correct sequence to form the divided multiphase signal, the plurality of periodic reset signals being produced by a combinational network of the reset signal generator, the combinational network is configured for generating a number of pulses based on the plurality of multiphase signals and performing a plurality of decimation stages to reduce the number of pulses within the pulse traces.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for implementing a multiphase divider that solves the phase ambiguity problem and forms a plurality of divided multiphase signals having a monotonic increasing phase with equal spacing and an ideal duty cycle of 50%.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The inventor herein has recognized that appropriate start-up conditions can be provided by means of a reset signal generation such that independent parallel dividers are forced to divide the multiphase signal in a correct order without phase ambiguity while maintaining a duty cycle that is ideally 50%.

Figure 1:
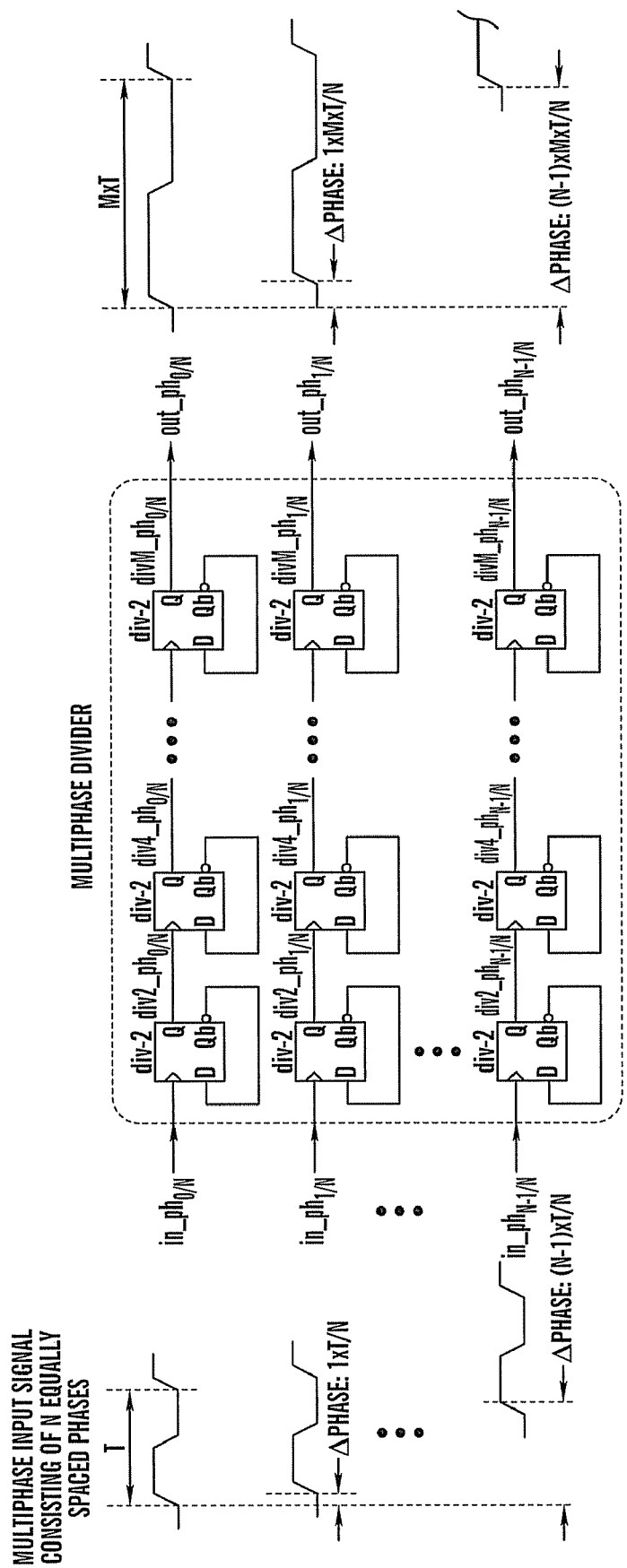
FIG. 1 illustrates a schematic diagram of a conventional multiphase divider scheme that suffers from phase ambiguity.
Figure 2:
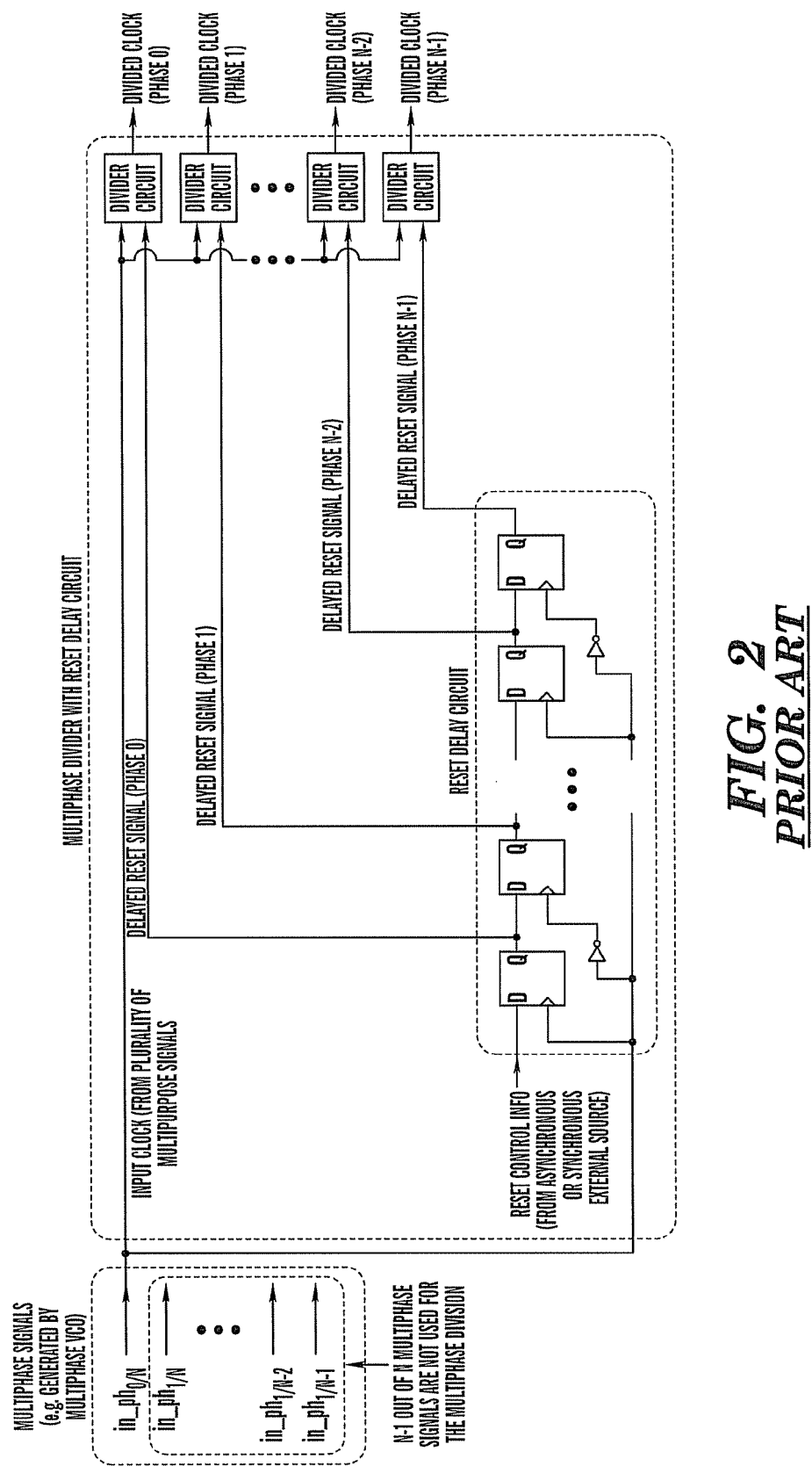
FIG. 2 illustrates a schematic diagram of another conventional multiphase divider scheme using a reset delay circuit and deriving a multiphase output from a single phase signal of a plurality of multiphase inputs.
Figure 3:
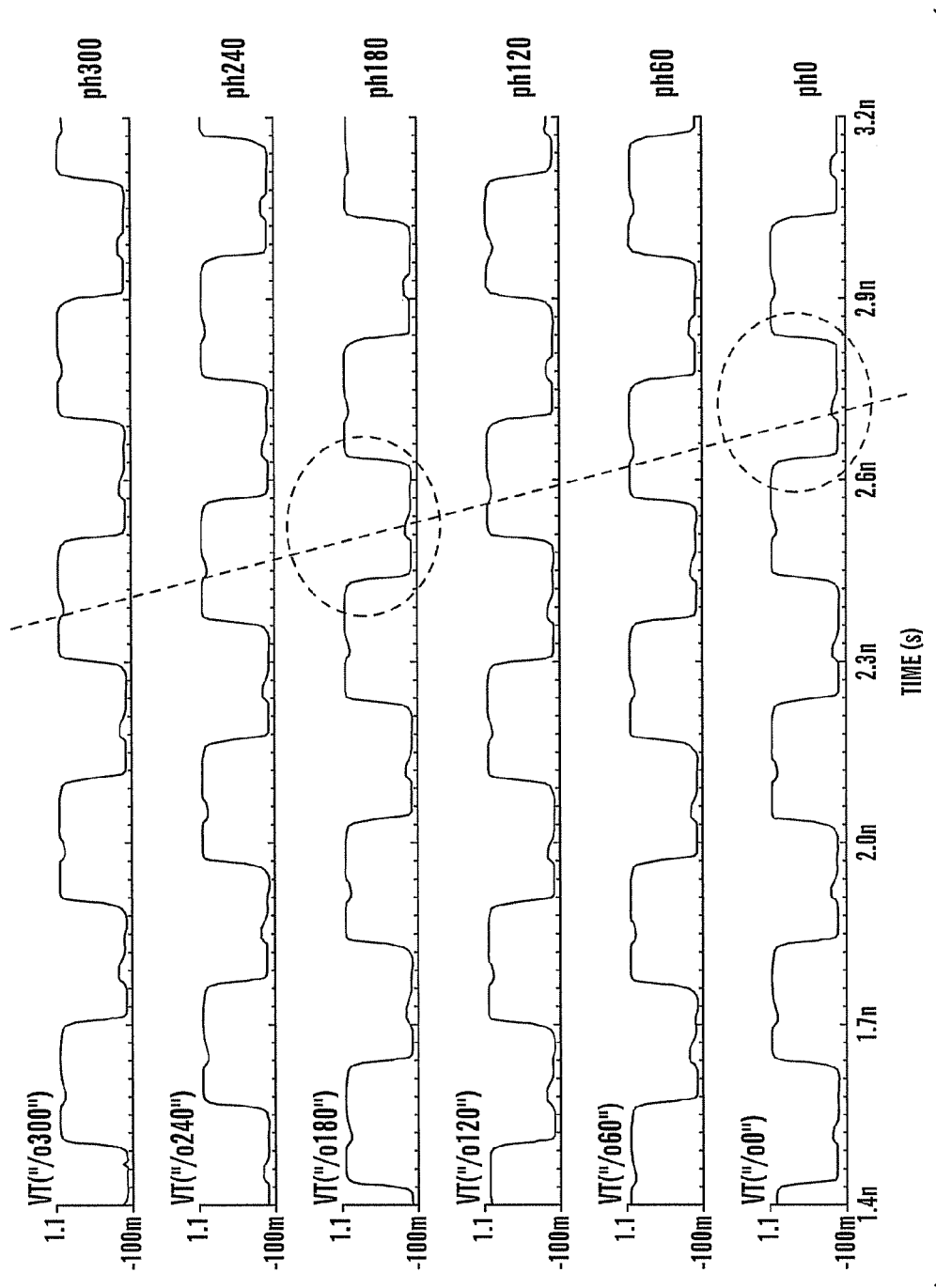
FIG. 3 illustrates an exemplary timing diagram showing a divided multiphase signal having phase ambiguity.
Figure 4:
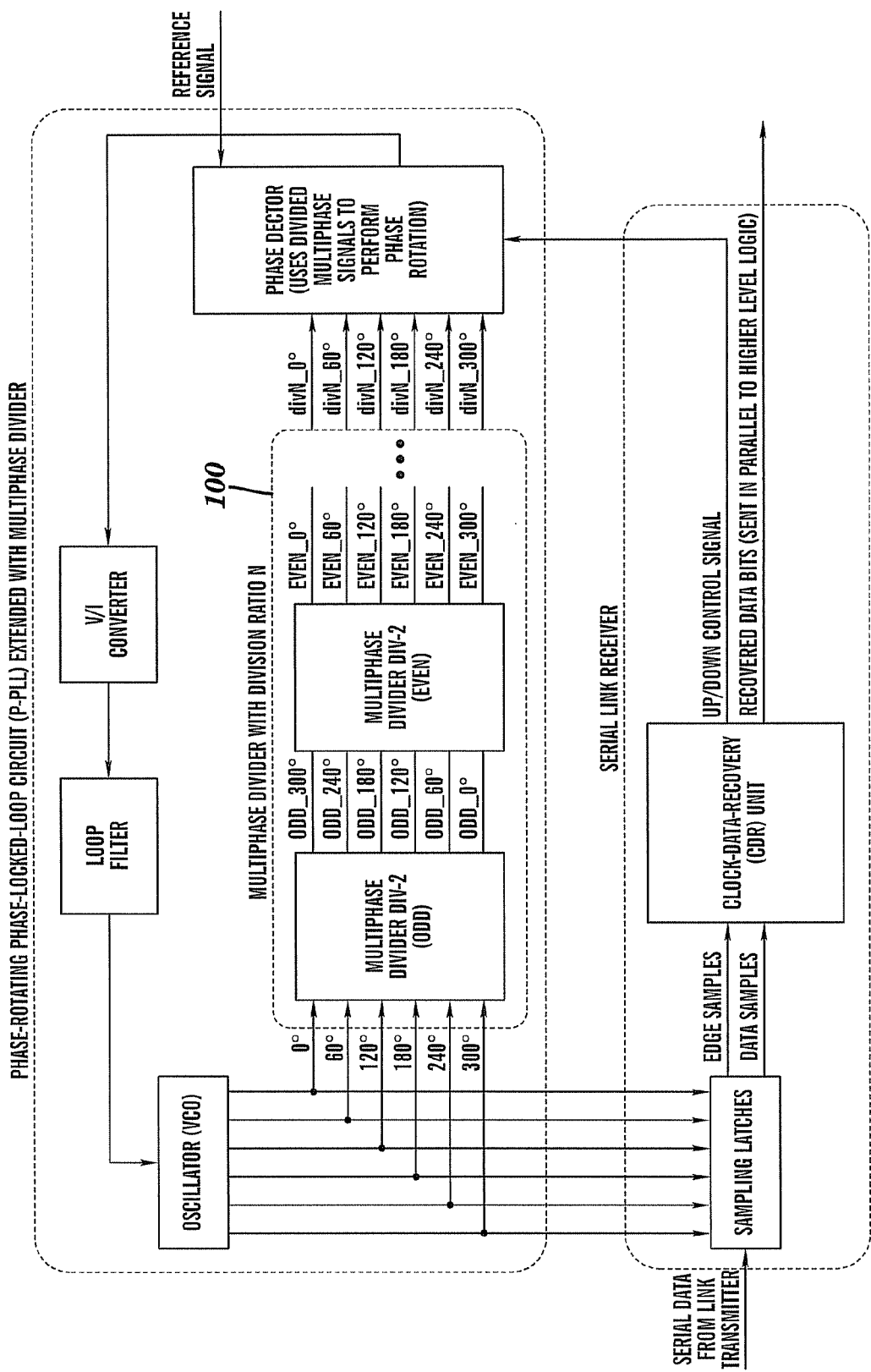
FIG. 4 illustrates a schematic diagram of a multiphase divider in accordance with one exemplary embodiment being incorporated in a feedback path from an oscillator to a phase detector in accordance with one exemplary embodiment of the present invention.

Multiphase signals are typically used in serial link receivers to provide the required sampling phases for the latches that sample the received serial data stream. An example of a serial link receiver used in conjunction with the multiphase divider of the present invention is shown in FIG. 4. The serial link receiver communicates with a phase-rotating PLL (P-PLL) that provides, according to one example, six phases to the sampling latches of the receiver. The P-PPL may be any conventional P-PPL known in the art. The sampling latches take a number of edge and data samples (e.g. 4 edge samples and 2 data samples taken from 2 received bits) of the incoming serial data stream from the link transmitter, which could for instance be located in the input-output device (I/O) of a central-processing-unit (CPU) whereas the receiver might reside for instance in the I/O of a memory chip attached to the CPU. The edge and data samples are then further processed in a clock-data-recovery (CDR) unit of the serial link receiver that provides the received data bits to a succeeding higher level logic. In addition, the CDR unit also outputs a control signal to a phase detector in the P-PLL that indicates whether the P-PLL has to increase or decrease the reference phase of its multiphase output signal. The reference phase could be any one of the multiphase signals that is correctly aligned to one of the edges of the received serial data stream. If for instance the edge of the sampling signal occurs prior to the edge of the data signal, the control signal generated by the CDR unit indicates that the phase should be increased (up control signal) because the sampling of the incoming data bit has occurred too early. Likewise, a signal for decreasing (down control signal) is indicated by the CDR unit if the sampling edge occurs after the data edge. In other words, if the phase needs to be adjusted, the P-PLL increments or decrements all of the phases of its multiphase signal by the same amount (e.g., $\alpha \cdot 2\pi/N$, where $\alpha$ is a fractional number between 0 and 1).

The rotation of the phase is performed by means of a phase interpolation within the phase detector. A non-limiting example of how phase interpolation or phase blending works can be found in U.S. patent application Ser. No. 60/216,952, filed Aug. 31, 2005, the contents of which are incorporated herein by reference thereto. The phase detector in the P-PLL needs for a proper operation a multiphase signal with the characteristics of having a monotonic increase of equally spaced phases as described above. The P-PLL includes other components, such as the I/V-converter and the loop filter, which may be any conventional converter and loop filter used in a conventional PLL that does not rotate the phase of its output signal(s).

Figure 5:
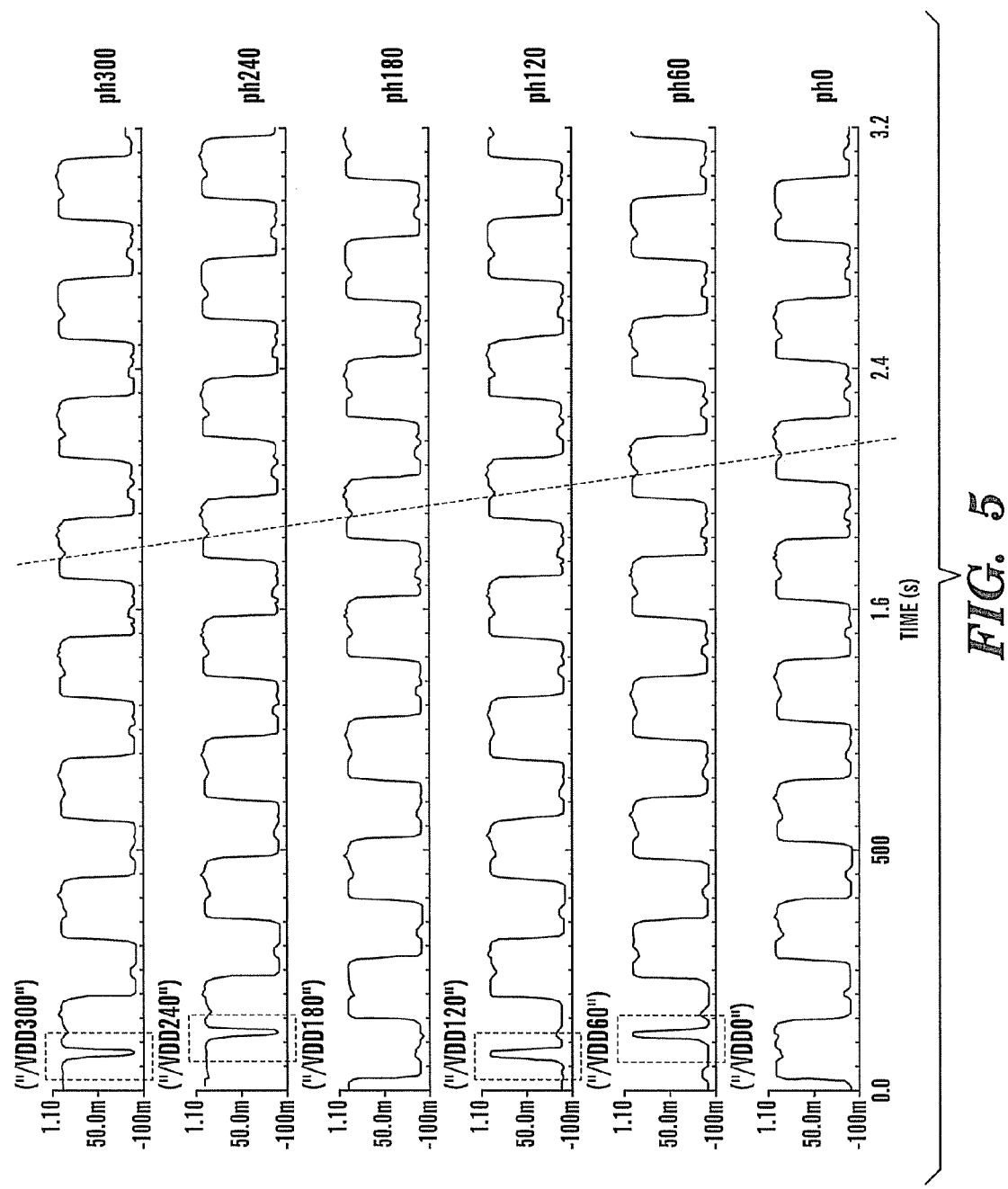
FIG. 5 illustrates another exemplary timing diagram showing a divided multiphase signal using the multiphase divider in accordance with one exemplary embodiment of the present invention.

An example of a correctly performed multiphase division using the proposed multiphase divider as will later be described in greater detail below is shown in FIG. 5. It can be seen that the phase of the divided multiphase signal is monotonically increasing with equal spacing and a 50% duty cycle. The dashed straight line indicates how the phase gets increased when going from one component of the multiphase signal to the next one. The boxes shown around the first cycles of the divided multiphase signal indicate where the correcting measures imposed by the reset signals come into play. During these time intervals the individual divider output signals are forced to assume the correct states.

Figure 6:
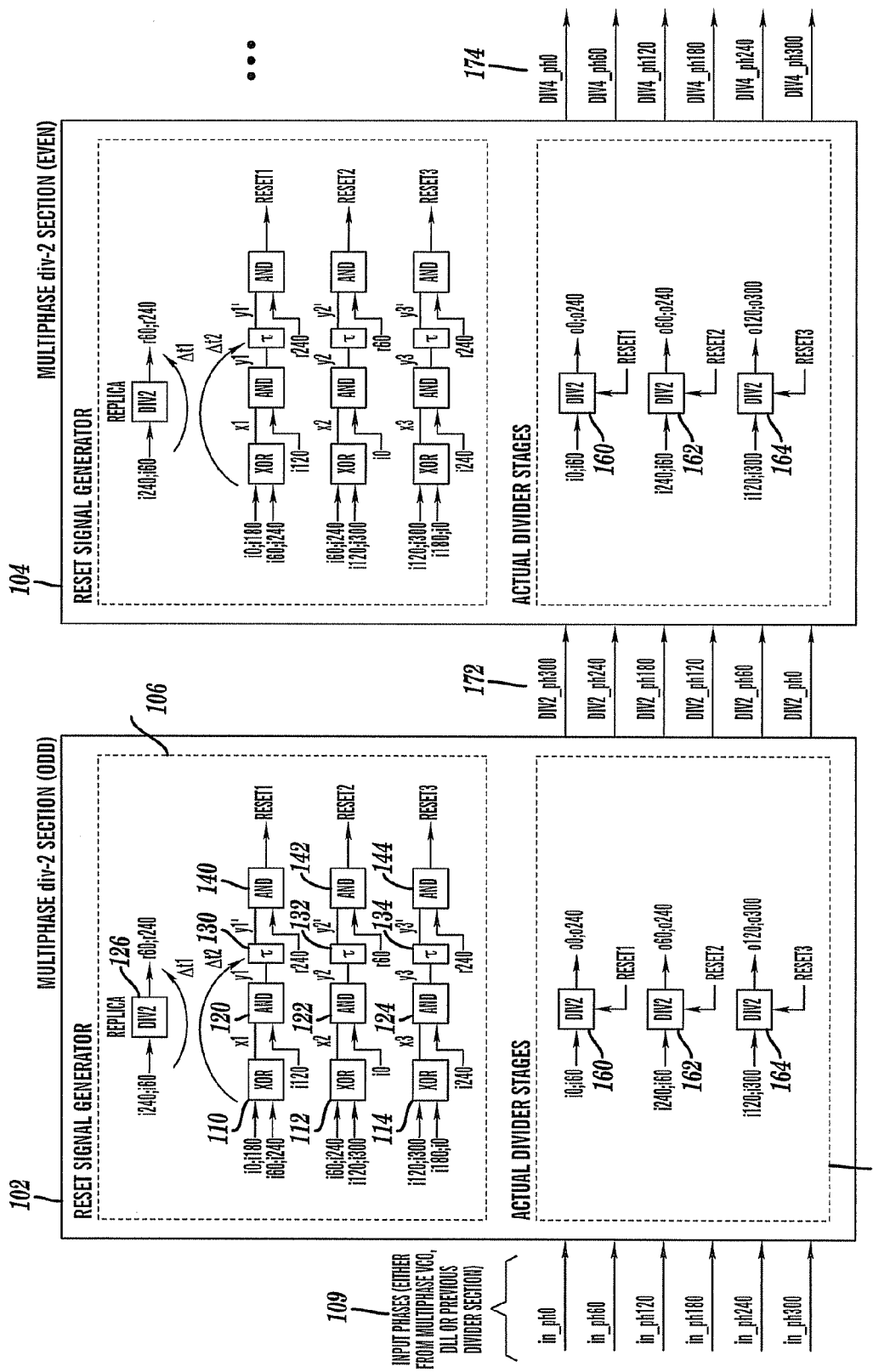
FIG. 6 illustrates a schematic diagram of the multiphase divider in accordance with one exemplary embodiment of the present invention.

Now turning to a discussion of a multiphase divider in accordance with one exemplary embodiment of the present invention. FIG. 6 illustrates a multiphase divider 100 in accordance with one exemplary embodiment of the present invention. The multiphase divider 100 may be incorporated in the feedback path from an oscillator (e.g., VCO) to a phase detector in order to make a P-PLL a frequency multiplying PLL as shown in FIG. 4. The multiphase divider 100 addresses the phase ambiguity problem occurring when dividing a multiphase signal with mutually independent divider stages. The multiphase divider 100 may be applied to a P-PLL type of serial link receiver. The multiphase divider 100 includes a first multiphase division section 102 (odd) and a second multiphase division section 104 (even) each dividing by a factor of two. The multiphase divider 100 further includes a reset signal generator 106 having combinational logic for producing periodic reset signals reset 1, reset 2, reset 3 to a resetable divider stage 108 of the multiphase divider 100.

The multiphase divider 100 includes six input phases 109 (in_ph0, in_ph60, in_ph120, in_ph180, in_ph240 and in_ph300-degrees). In an actual P-PLL receiver the six phases 109 could be used to implement a half rate system with 2 data samples (obtained by the phases in_ph60 and in_ph240) and 4 edge samples (obtained by the phases in_ph0, in_ph120, in_ph180 and in_ph300).

Figure 8:
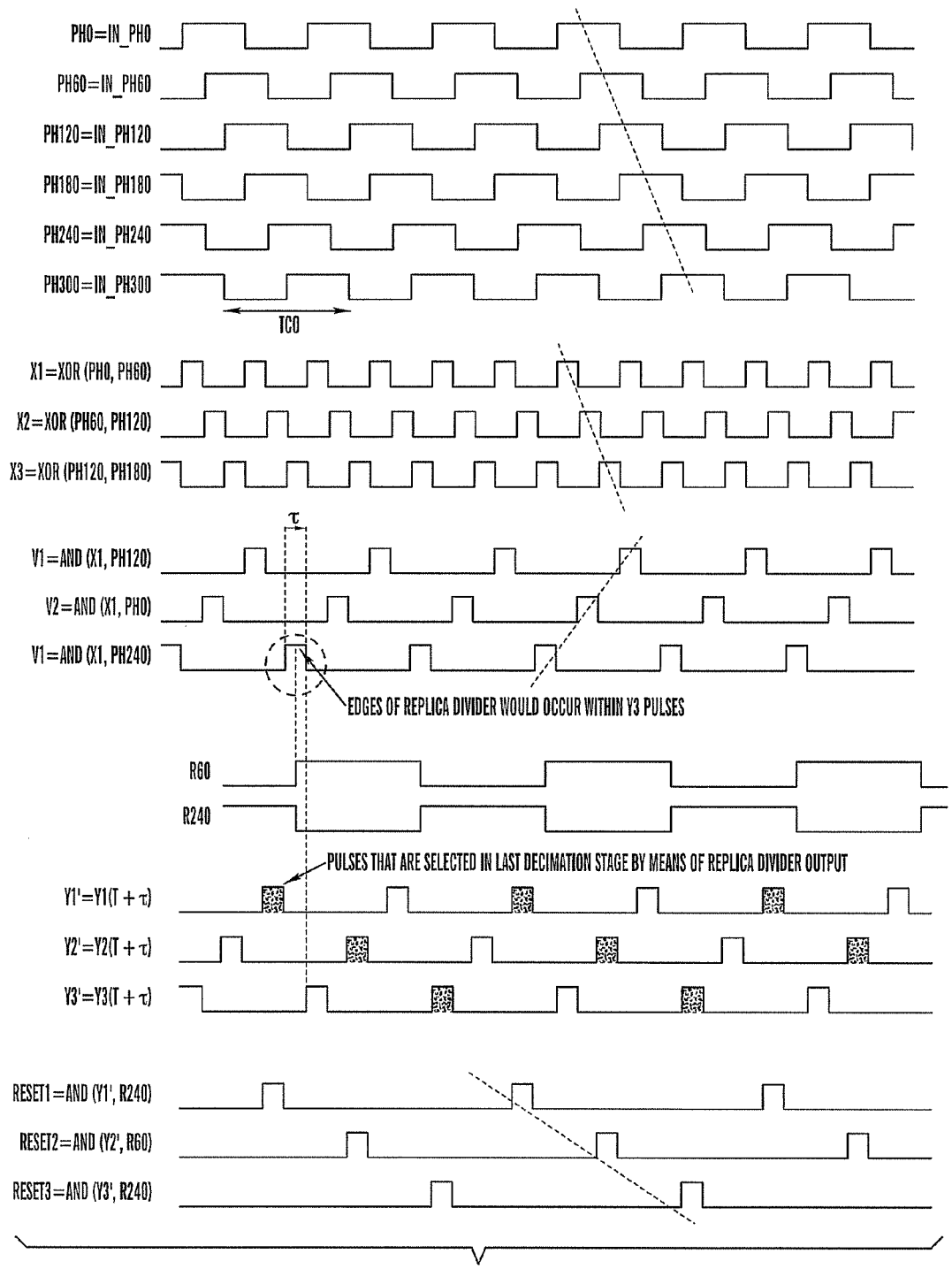
FIG. 8 illustrates a timing diagram of signals of the multiphase divider in accordance with one exemplary embodiment of the present invention.

In FIG. 6, the input phase signals 109 are first combined by XOR gates 110, 112, 114 in the following way:

x1=(i0;i180) XOR (i60;i240)

x2=(i60;i240) XOR (i120;i300)

x3=(i120;i300) XOR (i180;i0)

where for instance (i0;i180) denotes the differential input phase pair consisting of phases 0 and 180-degrees. To simplify matters in_ph0 equals i0, and likewise this nomenclature also applies to the other phase signals. The input phase signals 109 are correspondingly combined by exclusive OR gates or XOR gates resulting in signals or pulse traces x1, x2 and x3 as shown in FIG. 8. Signals x1, x2 and x3 contain the desired reset pulses that need to be filtered out by means of the succeeding decimation stages applied to the signals x1, x2 and x3 in the next steps. The succeeding decimation stages are configured to reduce the number of pulses within the pulse traces as shown in FIG. 8.

To perform the required filtering of the pulse traces x1, x2, x3 obtained after the XOR-operation of the input phase signals 109, two steps of decimation are performed. In the first decimation stage, the signals x1, x2 and x3 are fed to AND-gates 120, 122 and 124, respectively whose second input signals correspond to those in-phase input signals 109 that have not been used at the XOR-gates 110, 112, 114 of that branch. For instance at the AND-gate 120 the signal i120 is used because the second input signal x1 was derived from a subset of the input signals—namely (i0;i180) and (i60;i240)—that did not contain the signal i120. Likewise the phase signal i0 is taken as the second input for the AND-gate 122, while phase signal i240 is used as the second input for the AND-gate 124. This mapping of phase signals to the inputs of the AND-gates 120, 122, 124 of the first decimation stage takes into account that there are three independent in-phase components in this multiphase input signal 109—namely i0, i60 and i120, and three out-of-phase components—namely i180, i240 and i300 that are just the complement of the in-phase components. This first decimation stage yields the following signals:

y1=x1 AND i120 y2=x2 AND i0 y3=x3 AND i240 which are also shown in FIG. 8. This decimation stage reduces the number pulses in y1 through y3 by a factor of two with respect to the number of pulses in x1 through x3.

In the second decimation stage, the output (r60;r240) of a replica divider 126 located in the reset signal generator 106 performs a replica divide-by-2 stage. The replica divide-by-2 stage is performed in order to make sure that no feedback latency occurs that may deteriorate the duty cycle of the divided output signal. The replica divider 126 is considered a master divider performing a master divider stage. The differential outputs of the replica divider 126 labeled r60 and r240 are used to select the three final reset pulses reset1, reset2, reset3 that are then applied to resetable dividers 160, 162, 164 in the resettable divider stage 108 in order to force them to divide in a timely correct synchronous way.

Because the replica divider 126 is operated in parallel to the combinational logic (XOR-gates 110, 112, 114 and AND-gates 120, 122, 124) used to generate and decimate the reset pulses, the rising or falling edges of the replica divider output signals r60 and r240 do not occur within the pulse width of one of the pulses in signals y1 through y3. As such, outputs of the first decimation stage (XOR-gates 110, 112, 114 followed by the AND-gate 120, 122, 124)—namely y1, y2 and y3, are delayed by a delay τ 130, 132, 134 such that none of their pulses occur at the transitions of the replica divider signal. In other words, the delay τ is used to match the latency of the replica divider and the combinational logic so that the signals r60 and r240 can optimally be used in the final decimation stage to obtain the reset signals reset1, reset2 and reset3. The value of τ 130, 132, 134 implemented for instance as a cascade of inverter stages can be determined at the time of the circuit design based on simulation results of the replica divider latency Δt1 and the latency Δt2 through the first part of the combinational network whereas all of the three branches (XOR gate 110 and AND gate 120, XOR gate 112 and AND gate 122, XOR gate 114 and AND gate 124) ideally have the same latency Δt2 and hence the same amount of τ is needed for all of the three branches in the combinational network.

In FIG. 8, an example is shown of how the signals y1, y2, y3 are shifted (delayed) by τ. It can be seen that some of the pulses in y3 are hit by the edges of r60 and r240 (see for instance the encircled pulse in y3). The criterion for choosing τ is to avoid such a constellation between y60, r240 and y1, y2, y3. In this example y1, y2, y3 are therefore delayed by τ such that the edges of r60, r240 do not hit any of the pulses of y1, y2, y3.

The delayed signals y1, y2, y3 are indicated in FIG. 6 and FIG. 8 by a prime symbol:

y1'=y1(t+τ)

y2'=y2(t+τ)

y3'=y3(t+τ)

Ideally the rising or falling edges of the replica divider output signals r60, r240 have to occur in the middle of the spacing between two adjacent pulse pairs (e.g., in the middle of the spacing between the y3'-pulses and y1'-pulses). The spacing between two adjacent pulse pairs has a width of ⅙ of the period Tc0 of the input signal 109. Thus, the inserted delay τ 130, 132, 134 does not need to be very accurate as long as the condition is met that the edges of r60 and r240 occur within the period of time of ⅙·Tc0. This also greatly relaxes the requirements in terms of allowable process variations (PVT).

The last decimation stage finally yields the required reset signals by another AND-operation 140, 142, 144 applied to the delayed pulse patterns y1', y2', y3' of the previous decimation stage and the replica divider output signals r60, r240. It can be expressed as reset1=y1' AND r240 reset2=y2' AND r60 reset3=y3' AND r240

Note that the signals reset1 and reset3 are obtained by the AND-operation 140, 144 with r240 and signal reset2 is obtained by the AND-operation 142 with r60. The same reset signals may be obtained even if the replica divider 126 starts dividing with an opposite polarity. Thus, the phase ambiguity of the resetable dividers 160, 162, 164 can be removed because the reset signals reset1, reset2, reset3 still remain the same regardless of how the replica divider 126 starts dividing with respect to the multiphase input signal 109.

Figure 7:
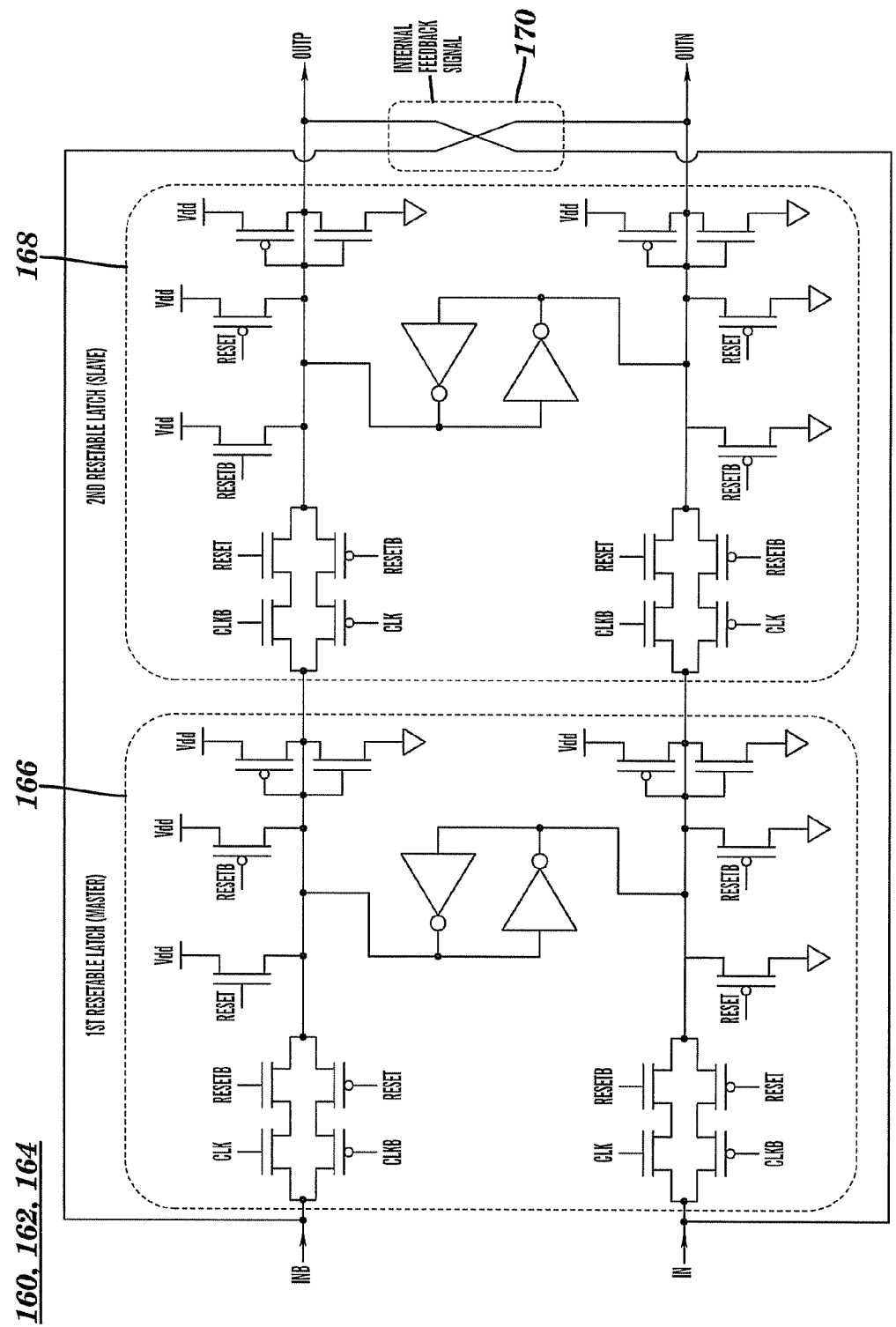
FIG. 7 illustrates a schematic diagram of a resetable divider used in the multiphase divider in accordance with one exemplary embodiment of the present invention.

FIG. 7 illustrates a transistor-level schematic of each of the resetable dividers 160, 162, 166 as used in FIG. 6. It is implemented in complementary pass-gate transistor logic (CPL) comprising of a master 166 and a slave 168 part of a D-flip flop with differential reset, data and clock inputs and a differential output signal out and outb. The reset signals reset1, reset2 and reset3 of FIG. 6 and FIG. 8 force the internal feedback paths 170 to assume well-defined states such that the phase ambiguity problem does not occur.

The reset signal generation performed in the first multiphase division section 102 as described above and illustrated in FIG. 6 results in a divided multiphase signal 172, which is in reversed order of the phase order of the input phase signal 109. This is indicated in FIG. 6 by the order of how the individual components of the multiphase signals 109, 172 and 174 are labeled. For instance, the input phase signal 109 at the first multiphase division section 102—the odd multiphase divider stage (left block), are labeled from top to bottom starting with in_ph0 down to in_ph300. At the output 104 of the first multiphase division section 102, the signals are labeled from top to bottom starting with div2_ph300 and ending with div2_ph0. At the second multiphase division section 104—the even multiphase divider stage (right block), outputs 174 are reversed so that the signal labeling starts with div4_ph0 at the top and ends with div4_ph300 at the bottom. This alternating order of multiphase signals is caused by the chosen definition of the XOR-operation and the successive decimation operations and makes it necessary to distinguish between odd and even divider stages. The distinction between the odd and even divider stages is associated to the last decimation stage where the reset 1 and reset 3 signals are generated with r60 instead of r240 (see FIG. 6). In sum, the reset signals at the last decimation stage in the odd and even sections are as follows:

reset1_odd=y1' AND r240 reset1_even=y1' AND r60 reset2_odd=reset2_even=y2' AND r60 reset3_odd=y3' AND r240 reset3_even=y3' AND r60

However, if only a multiphase divide-by-two division is to be performed, it is sufficient to just use the above described odd divider stage. If the multiphase divider should perform a divide-by-four division, an odd followed by an even divider stage must be used. Analogously, at a divide-by-eight division, the succession of divider stages is: odd-even-odd and so forth for a higher division factor (e.g., ⅟32: odd-even-odd-even-odd, where each odd and even stage is defined as shown in FIG. 6).

If a different definition of the XOR-operation is applied, like for instance x1_alt=(i0;i180) XOR (i300;i120)

x2_alt=(i300;i120) XOR (i240;i60)

x3_alt=(i240;i60) XOR (i180;i0)

where _alt stands for 'alternative', the direction of phase increase indicated by the dashed diagonal lines in FIG. 8 is reversed. Likewise the definition of the first and second decimation stages has to be changed as well:

y1_alt=x1 AND i60 y2_alt=x2 AND i180 y3_alt=x3 AND i300 y1'_alt=y1_alt(t+τ)

y2'_alt=y2_alt(t+τ)

y3'_alt=y3_alt(t+τ)

reset1_alt=y1' AND r60 reset2_alt=y2' AND r60 reset3_alt=y3' AND r240

This is an example of another implementation. It should be understood that there are many other versions of implementation depending on how the pulse generation, the pulse decimation and the replica divider input signals are defined with respect to each other. All of these potential implementations rely in principle on using a reset signal generator consisting of a replica divider and a combinational network to produce a set of reset signals that force the actual divider stages in the multiphase divider to divide in a timely correct manner such that the phase ambiguity problem is eliminated.

Advantageously, the present invention described above includes, without limitation: the application of a multiphase divider in a P-PLL type of serial link receiver to accomplish a frequency multiplication within the P-PLL, which in turn allows reducing the external reference signal by a factor equal to the division ratio of the multiphase divider and hence allows saving power in the clock distribution network because of the slower reference clock signal.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A multiphase divider, comprising:
   a plurality of resetable dividers configured for performing resetable divider stages to a plurality of multiphase signals forming a plurality of divided multiphase signals having a monotonic increasing phase with equal spacing and an ideal duty cycle of 50%, wherein the plurality of divided multiphase signals have no phase ambiguity; and
   a reset signal generator configured for producing a plurality of periodic reset signals to the plurality of resetable dividers to enable the plurality of resetable dividers to divide the plurality of multiphase signals in a timely correct sequence to form the divided multiphase signal, the plurality of periodic reset signals being produced by a combinational network of the reset signal generator, the combination network is configured for generating a number of pulses based on the plurality of multiphase signals and performing a plurality of decimation stages and wherein said periodic reset signals are generated solely in response to said plurality of multiphase signals.

2. The multiphase divider as in claim 1, wherein logical exclusive OR gates of the combinational network generate the number of pulses based on the plurality of multiphase signals.

3. The multiphase divider as in claim 1, wherein logical AND gates perform the plurality of decimation stages.

4. The multiphase divider as in claim 1, wherein the reset generator includes a master divider operated by a subset of the plurality of multiphase signals, the master divider is configured for selecting a group of the pulses, enabling the production of the plurality of periodic reset signals.

* * * * *